United States Patent
Nogami et al.

(10) Patent No.: US 8,816,493 B2
(45) Date of Patent: Aug. 26, 2014

(54) SEMICONDUCTOR DEVICE

(71) Applicant: Mitsubishi Electric Corporation, Tokyo (JP)

(72) Inventors: Yoichi Nogami, Tokyo (JP); Yoshitsugu Yamamoto, Tokyo (JP); Akira Inoue, Tokyo (JP); Yoshinori Yokoyama, Tokyo (JP); Jun Fujita, Tokyo (JP); Kazuyo Endo, Tokyo (JP); Shinnosuke Soda, Tokyo (JP); Kazuyasu Nishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/921,695

(22) Filed: Jun. 19, 2013

(65) Prior Publication Data

US 2014/0077280 A1  Mar. 20, 2014

(30) Foreign Application Priority Data

Sep. 18, 2012 (JP) ................................ 2012-203975

(51) Int. Cl.
- *H01L 23/12* (2006.01)
- *H01L 29/78* (2006.01)
- *H01L 23/00* (2006.01)
- *H01L 23/60* (2006.01)

(52) U.S. Cl.
CPC .............. *H01L 23/564* (2013.01); *H01L 29/78* (2013.01); *H01L 23/60* (2013.01)

USPC ............................. 257/704; 257/680; 257/710

(58) Field of Classification Search
CPC .......... H01L 23/02; H01L 23/06; H01L 23/10
USPC ................... 257/680, 704, 705, 710
See application file for complete search history.

(56) References Cited

U.S. PATENT DOCUMENTS

| 5,604,160 A | 2/1997 | Warfield |
| 6,867,366 B2 * | 3/2005 | Nemoto ........................ 174/559 |
| 2007/0223548 A1 * | 9/2007 | Ohbo et al. ................. 372/44.01 |
| 2012/0068578 A1 | 3/2012 | Takahashi |
| 2013/0049543 A1 * | 2/2013 | Amano et al. ................. 310/344 |

FOREIGN PATENT DOCUMENTS

| JP | 10-74855 A | 3/1998 |
| JP | 11-74397 A | 3/1999 |
| JP | 2000-348630 A | 12/2000 |
| JP | 2004-356395 A | 12/2004 |
| JP | 2012-65155 A | 3/2012 |

* cited by examiner

Primary Examiner — Matthew E Warren
(74) Attorney, Agent, or Firm — Leydig, Voit & Mayer, Ltd.

(57) ABSTRACT

A semiconductor device includes: a substrate; a semiconductor element on the substrate; an interconnection on the substrate and electrically connected to the semiconductor element; a window frame member on the substrate, surrounding the semiconductor element, and in contact with the interconnection; and a sealing window bonded to the window frame member and encapsulating the semiconductor element. The window frame member is a low melting glass and has a sheet resistance of $10^6$-$10^{10}$ $\Omega/\square$.

8 Claims, 3 Drawing Sheets

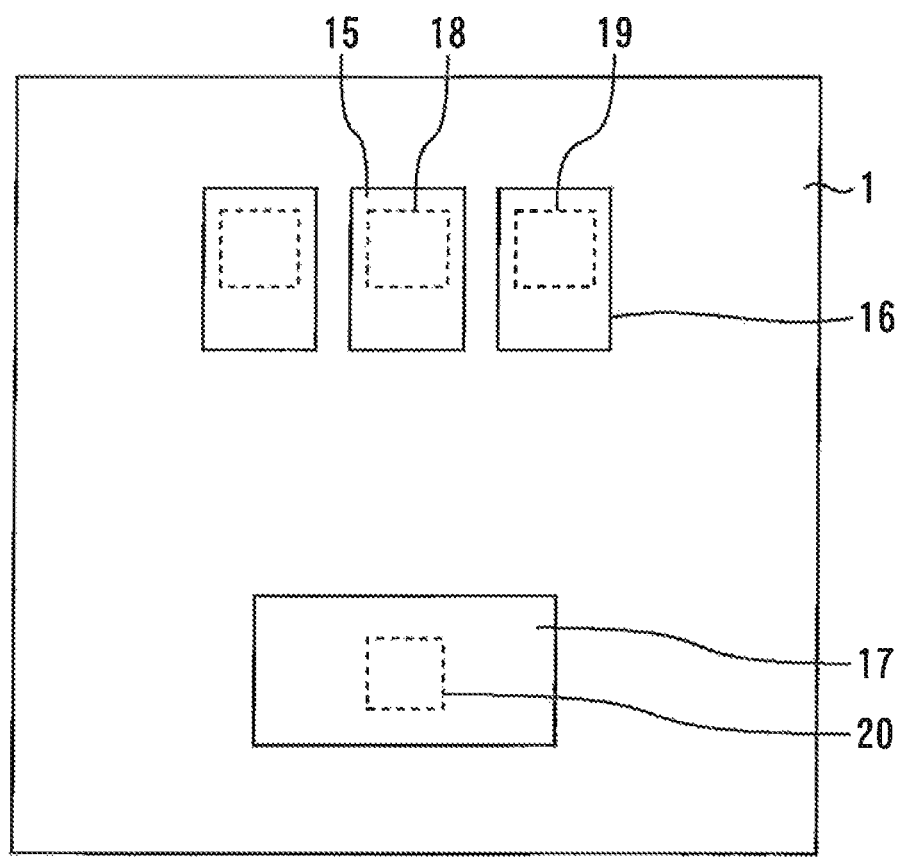

SEMICONDUCTOR DEVICE

BACKGROUND OF THE INVENTION

1. Field of the Invention

The present invention relates to a semiconductor device having a hermetically sealed hollow structure.

2. Background Art

Since general-purpose high frequency semiconductor devices, including field effect transistor devices of compound semiconductor such as GaAs or GaN, etc., have rapidly become prevalent, there has been a great need to reduce their cost. In order to meet this need, low-cost molded packages have been adopted instead of conventional fully hermetic metal packages. However, the use of a non-hermetic package such as a molded package requires that the semiconductor device contained therein be moisture resistant in order to prevent various types of degradation due to moisture. A conventional method for providing the semiconductor device with moisture resistance has been to prevent infiltration of moisture into the semiconductor device by covering the surfaces of the semiconductor elements and various metal films on the principal surface of the substrate using a thick insulating film formed by plasma CVD, etc.

Insulating films formed by plasma CVD or the like, however, may tend to absorb moisture, depending on the conditions under which they are formed. Further, the thick insulating film, unlike a thin insulating film, may peel off due to stress change resulting from absorption of slight moisture by the film. This degrades the coverage performance and quality of the film at step portions associated with the configurations of the transistors of the semiconductor device. As a result, the thick insulating film is likely to transmit and absorb moisture, meaning that the film cannot fully prevent infiltration of moisture into the semiconductor elements. Various types of degradation have been found to occur due to such moisture infiltration. Further, the increased thickness of the insulating film results in increased capacitive components and hence degraded high frequency characteristics of the semiconductor device.

In order to solve this problem, a semiconductor device having a hermetically sealed hollow structure has been proposed in which semiconductor elements are hermetically sealed by bonding a cap wafer to the principal surface of the substrate using glass frit as adhesive, which is disposed on the principal surface of the substrate in such a manner as to surround each semiconductor element (see, e.g., Japanese Laid-Open Patent Publication No. H10-74855).

SUMMARY OF THE INVENTION

There are cases in which a semiconductor device is destroyed by electrostatic discharge (ESD). A known technique for preventing this is to incorporate an electrostatic protection circuit in the device, which, however, results in increased surface area of the device, thus preventing cost reductions. The above Patent Publication neither describes nor suggests electrostatic protection.

In view of the above-described problems, an object of the present invention is to provide a semiconductor device which can prevent the degradation of the high frequency characteristics and improve the electrostatic strength without additional cost.

According to the present invention, a semiconductor device includes: a substrate; a semiconductor element on the substrate; an interconnection on the substrate and electrically connected to the semiconductor element; a window frame member on the substrate, surrounding the semiconductor element, and being in contact with the interconnection; and a sealing window bonded to the window frame member and encapsulating the semiconductor element. The window frame member is made from a low melting glass and has a sheet resistance of $10^6$-$10^{10}$ $\Omega/\square$.

The present invention makes it possible to prevent the degradation of the high frequency characteristics and improve the electrostatic strength without additional cost.

Other and further objects, features and advantages of the invention will appear more fully from the following description.

BRIEF DESCRIPTION OF THE DRAWINGS

FIG. 5 is a bottom view of the semiconductor device of the second embodiment.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
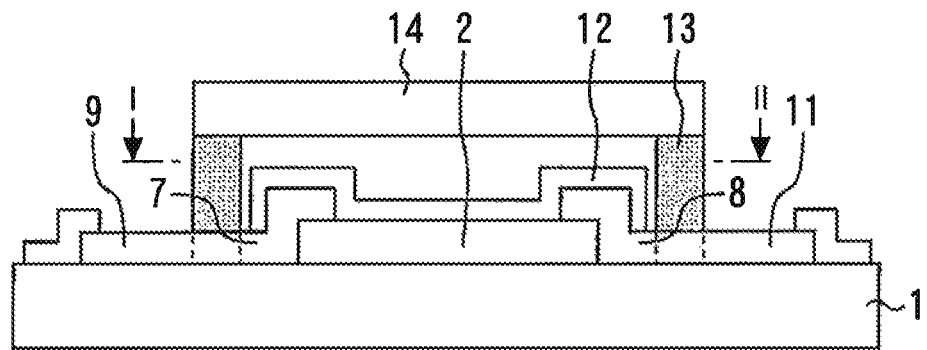
FIG. 1 is a cross-sectional view showing a semiconductor device in accordance with a first embodiment of the present invention.
Figure 2:
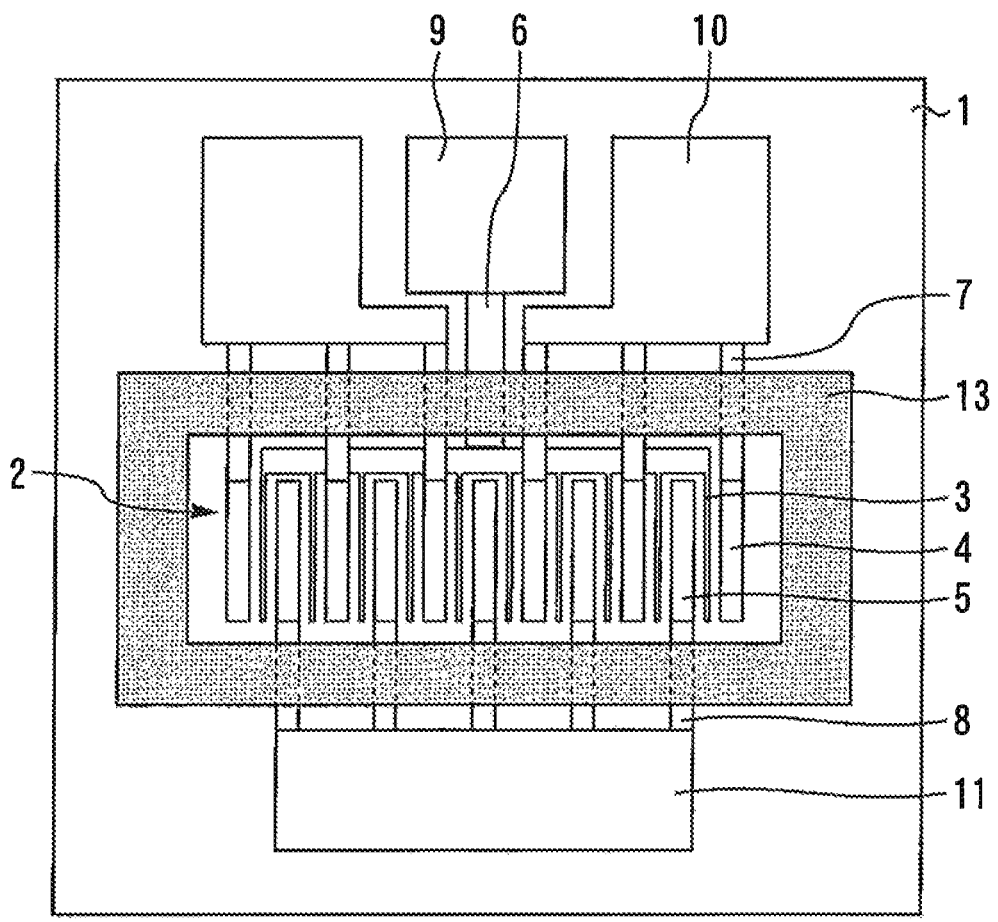
FIG. 2 is a cross-sectional top view of the semiconductor device taken along line I-II of FIG. 1.

FIG. 1 is a cross-sectional view showing a semiconductor device in accordance with a first embodiment of the present invention. FIG. 2 is a cross-sectional top view of the semiconductor device taken along line I-II of FIG. 1. A semiconductor element 2 is provided on a substrate 1 of Si. The semiconductor device of the present embodiment is a high frequency high power amplifier, and the semiconductor element 2 is a field effect transistor. It should be noted that the semiconductor element 2 may be a bipolar transistor, etc. instead of a field effect transistor. The field effect transistor (i.e., the semiconductor element 2) is fabricated directly on the substrate 1.

The semiconductor element 2 has gate electrodes 3, source electrodes 4, and drain electrodes 5. Gate interconnections 6, source interconnections 7, and drain interconnections 8 are disposed on the substrate 1. Each gate interconnection 6 is electrically connected at one end to a different one of the gate electrodes 3 and at the other end to a common gate pad 9. Each source interconnection 7 is electrically connected at one end to a different one of the source electrodes 4 and at the other end to a common source pad 10. Each drain interconnection 8 is electrically connected at one end to a different one of the drain electrodes 5 and at the other end to a common drain pad 11. The semiconductor element 2 is covered with a surface protective film 12 which is an SiN film or the like formed by plasma CVD.

A window frame member 13 is disposed on the substrate 1 so as to surround a sealing area which has the semiconductor element 2 thereon. The window frame member 13 intersects and is in contact with the gate interconnections 6, the source interconnections 7, and the drain interconnections 8. A sealing window 14 is bonded to the window frame member 13, thereby encapsulating the semiconductor element 2.

The window frame member 13 is made from a low melting glass containing metal and hence having conductivity, e.g., vanadium glass. Vanadium glass can be sintered at 400° C. or less, has high moisture resistance, and has a black tone. It should be noted that the window frame member 13 may be made from a low melting glass which can be sintered at 450° C. or less, such as bismuth-based glass, lead-based glass, or lead fluoride-based glass.

The present embodiment is characterized in that the window frame member 13 of a low melting glass has a sheet resistance (or surface resistance) of $10^6$-$10^{10}$ $\Omega/\square$. In order to achieve this sheet resistance, the window frame member 13 may be made from vanadium glass and have a thickness of approximately 10-100 μm since vanadium glass has a specific electrical resistance of $10^6$-$10^8$ $\Omega\cdot cm$. Other types of low melting glass have a specific resistance of approximately $10^{12}$ $\Omega\cdot cm$ and hence are not suitable for forming the window frame member 13; the window frame member 13 must have a thickness of 1 m or more in order to have the required sheet resistance if it is made from a low melting glass other than vanadium glass. However, such a low melting glass may be mixed with conductive filler such as carbon material so as to have a specific electrical resistance of $10^6$-$10^8$ $\Omega\cdot cm$, and the window frame member 13 may be made from this low melting glass. In this way the window frame member 13 can be formed to have both the required sheet resistance and a suitable thickness.

If the window frame member 13 has a sheet resistance of $10^{10}$ $\Omega/\square$ or less, the semiconductor element 2 is unlikely to be electrostatically charged, resulting in increased electrostatic strength. Specifically, the negative charge trapped on the gate electrodes 3 of the semiconductor element 2 escapes to the source electrode 4 side of the semiconductor element 2 through the window frame member 13 of a low melting glass, making it possible to prevent breakdown of the gate without incorporating an electrostatic protection circuit in the semiconductor device. In this way the electrostatic strength of the semiconductor device can be improved without additional cost.

Further, if the window frame member 13 has a sheet resistance of $10^6$ $\Omega/\square$ or more, the charge transfer rate is slow, making it possible to prevent shorting between the gate electrodes 3, the source electrodes 4, and the drain electrodes 5 via the window frame member 13.

Further, since the semiconductor element 2 is mounted in a hollow space hermetically enclosed by the window frame member 13 and the sealing window 14, the semiconductor element 2 can be provided with moisture resistance, regardless of its structure. Particularly, the window frame member 13 may be made from vanadium glass, which has high moisture resistance, to further improve the moisture resistance of the semiconductor element 2. Further, since the semiconductor element 2 is surrounded by hollow space, it is possible to minimize the capacitive components of the semiconductor device and thereby prevent the degradation of its high frequency characteristics.

Table 1 below lists the Young's modulus and the coefficient of thermal expansion of various materials. Table 2 shows the amounts of curvature of laminates when they are fixed at one end and their temperature is varied by 200 degrees, wherein each laminate is made up of two strip-shaped substrates (4 mm long and 0.1 mm thick) bonded together, with each substrate being formed of a material selected from among the materials listed by Table 1.

TABLE 1

|  | Young's modulus [GaPa] | coefficient of thermal expansion [×$10^{-6}$/K] |
|---|---|---|
| Si | 130 | 2.4 |
| SiC | 430 | 4.68 |
| GaN | 181 | 5.59 |
| Pyrex | 61 | 3.25 |
| alkali-free glass | 77 | 3.8 |
| soda-lime glass | 71 | 8.5 |
| vanadium glass | 53 | 6.0 |

TABLE 2

|  | Pyrex | alkali-free glass | soda-lime glass | vanadium glass |
|---|---|---|---|---|
| Si | 9.8 | 17 | 72 | 41 |
| SiC | 13 | 8.5 | 36 | 11 |
| GaN | 26 | 20 | 33 | 4.4 |

If the semiconductor device has an amount of curvature more than 50 μm, the device cannot be used in practice due to problems associated with its mounting. Therefore, the difference in coefficient of linear expansion between the sealing window 4 and the substrate 1 must be no more than $4.3 \times 10^{-6}$ [/K]. For example, if the substrate 1 is Si, the material of the sealing window 14 may be a glass having a coefficient of linear expansion close to that of Si. However, the sealing window 14 is more preferably formed of the same material as the substrate 1 (i.e., Si), since in that case the substrate 1 is less unlikely to be subjected to warpage, etc., thus making it possible to reduce the thickness of the substrate 1. This also applies to cases in which the substrate 1 is a semiconductor substrate of SiC, GaAs, or GaN, etc. or an insulating substrate of sapphire or ceramic, etc. Therefore, it is preferable that the material of the sealing window 14 be the same as that of the substrate 1, or have a coefficient of linear expansion which differs from the coefficient of linear expansion of the substrate 1 by no more than $4.3 \times 10^{-6}$ [/K].

Further, the low melting glass from which the window frame member 13 is made preferably has a higher infrared absorption than the substrate 1 and the sealing window 14. This allows the low melting glass to be selectively heated by infrared radiation, making it possible to melt the low melting glass without thermally destroying the semiconductor element 2. In this pressure sintering process, the sealing window 14 may be pressed against the low melting glass for forming the window frame member 13.

Second Embodiment

Figure 3:
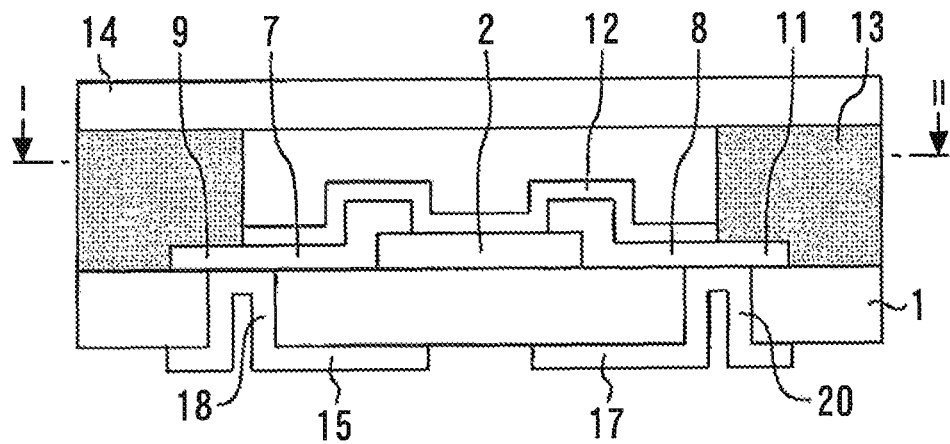
FIG. 3 is a cross-sectional view showing a semiconductor device in accordance with a second embodiment of the present invention.
Figure 4:
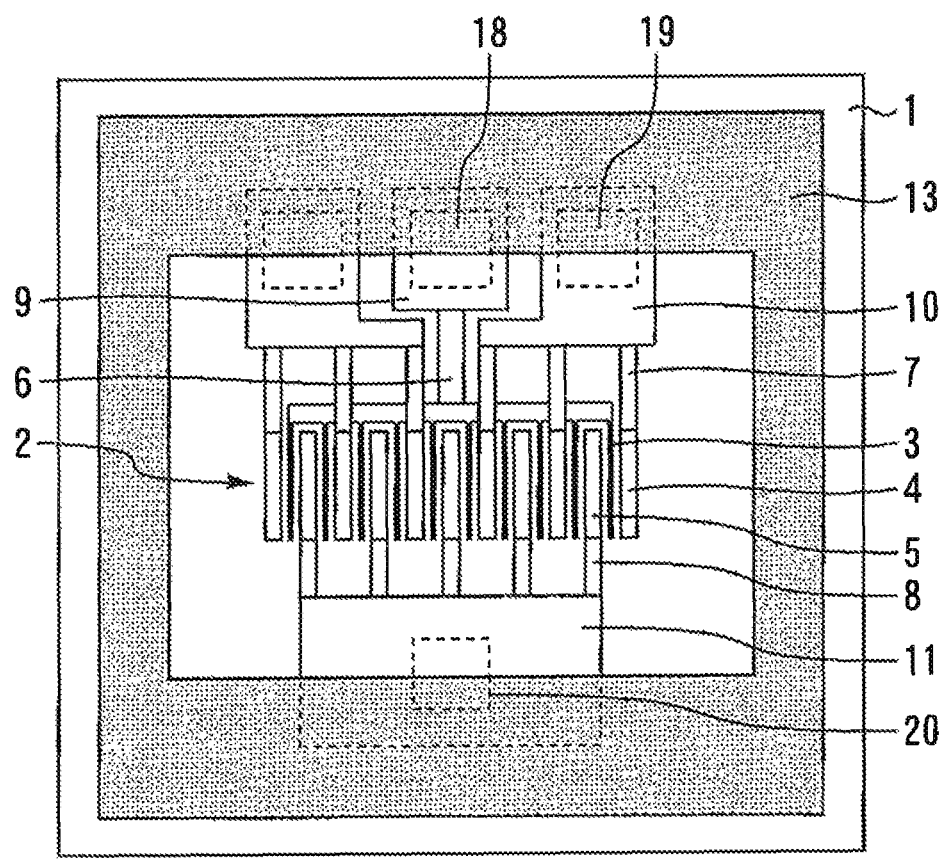
FIG. 4 is a cross-sectional top view of the semiconductor device taken along line I-II of FIG. 3.

FIG. 3 is a cross-sectional view showing a semiconductor device in accordance with a second embodiment of the present invention. FIG. 4 is a cross-sectional top view of the semiconductor device taken along line I-II of FIG. 3. FIG. 5 is a bottom view of the semiconductor device of the second embodiment.

Bottom surface pads 15, 16, and 17 are provided on the bottom surface of the substrate 1. Via-holes 18, 19, and 20 pass through the substrate 1 and electrically connect a gate pad 9, a source pad 10, and a drain pad 11 to the bottom surface pads 15, 16, and 17, respectively.

In the present embodiment, as in the first embodiment, a window frame member 13 of a low melting glass having a sheet resistance of $10^6$-$10^{10}$ $\Omega/\square$ intersects and is in contact with the gate pad 9, the source pad 10, and the drain pad 11. In this way the present embodiment can provide the same advantages as the first embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-203975, filed on Sep. 18, 2012, including specification, claims, drawings, and summary, on which the Convention priority of the present application is based, is incorporated herein by reference in its entirety.

What is claimed:

1. A semiconductor device comprising:
   a substrate;
   a semiconductor element on the substrate;
   an interconnection on the substrate and electrically connected to the semiconductor element;
   a window frame member on the substrate, surrounding the semiconductor element, and in contact with the interconnection; and
   a sealing window bonded to the window frame member and encapsulating the semiconductor element, wherein the window frame member is made from a low melting glass and has a sheet resistance of $10^6$-$10^{10}$ $\Omega/\square$.

2. The semiconductor device according to claim 1, wherein the semiconductor element has first and second terminals, and
   the interconnection has first and second interconnections electrically connected to the first and second terminals, respectively.

3. The semiconductor device according to claim 2, wherein the semiconductor element is a field effect transistor,
   the first terminal is a gate electrode of the field effect transistor, and
   the second terminal is a source electrode of the field effect transistor.

4. The semiconductor device according to claim 1, wherein the low melting glass is selected from the group consisting of vanadium glass, bismuth-based glass, lead-based glass, and lead fluoride-based glass.

5. The semiconductor device according to claim 1, wherein the sealing window and the substrate are the same material.

6. The semiconductor device according to claim 1, wherein the low melting glass has a higher infrared absorption than the substrate and the sealing window.

7. The semiconductor device according to claim 1, further comprising:
   first and second bottom surface pads on a bottom surface of the substrate; and
   first and second via-holes passing through the substrate and electrically connecting the first and second interconnections to the first and second bottom surface pads, respectively.

8. The semiconductor device according to claim 1, where the sealing window has a coefficient of linear expansion which differs from coefficient of linear expansion of the substrate by no more than $4.3\times10^{-6}$ [/K].

* * * * *